US008831693B2

(12) United States Patent
Shiono et al.

(10) Patent No.: US 8,831,693 B2
(45) Date of Patent: *Sep. 9, 2014

(54) MOBILE TERMINAL AND NOISE PREVENTION STRUCTURE OF MOBILE TERMINAL

(75) Inventors: Katsumi Shiono, Tokyo (JP); Kenji Fukazawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/560,488

(22) Filed: Jul. 27, 2012

(65) Prior Publication Data

US 2012/0302296 A1 Nov. 29, 2012

Related U.S. Application Data

(63) Continuation of application No. 12/159,969, filed as application No. PCT/JP2007/050762 on Jan. 19, 2007.

(30) Foreign Application Priority Data

Jan. 20, 2006 (JP) .................................. 2006-012295

(51) Int. Cl.
| | |
|---|---|
| *H04M 1/00* | (2006.01) |
| *H04R 17/02* | (2006.01) |
| *H05K 9/00* | (2006.01) |
| *H04R 1/08* | (2006.01) |
| *H04M 1/19* | (2006.01) |
| *H04M 1/03* | (2006.01) |
| *H04M 1/02* | (2006.01) |

(52) U.S. Cl.
CPC ............... *H04M 1/03* (2013.01); *H05K 9/0084* (2013.01); *H04M 1/0214* (2013.01); *H05K 9/0022* (2013.01); *H04R 1/086* (2013.01); *H04M 1/19* (2013.01); *H04R 2499/11* (2013.01)
USPC ........................................ 455/575.1; 381/355

(58) Field of Classification Search
USPC ..................... 455/575.1, 550.1; 435/95, 100; 381/355, 189, 71.7, 152
See application file for complete search history.

(56) References Cited

U.S. PATENT DOCUMENTS

| | | | | |
|---|---|---|---|---|
| 5,836,790 | A | * | 11/1998 | Barnett .................... 439/620.22 |
| 2005/0037748 | A1 | * | 2/2005 | Sawano ........................ 455/423 |
| 2006/0093177 | A1 | * | 5/2006 | Kobayashi ..................... 381/355 |

FOREIGN PATENT DOCUMENTS

JP 7283853 A * 10/1995 ............. H04M 1/03

* cited by examiner

*Primary Examiner* — San Htun
*Assistant Examiner* — Erica Navar
(74) *Attorney, Agent, or Firm* — Sughrue Mion, PLLC

(57) ABSTRACT

A microphone (130) is fitted with a mounting portion (130*a*) of a front case (12) in a state being set to a microphone folder (134). A metallic mesh-wise sheet (132) is attached to a front face of the microphone. When an EL sheet (110) on a rear face of the front case emits light by supplying power to it, electrical noise is radiated from the EL sheet. The mesh-wise sheet of the front face of the microphone blocks the electrical noise from the EL sheet, which may enter through a sound hole (131) to the inside of the microphone.

4 Claims, 7 Drawing Sheets

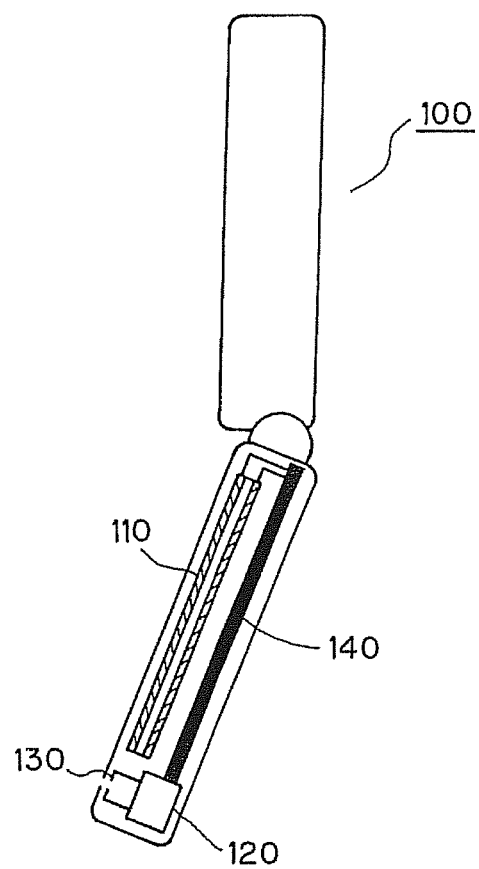
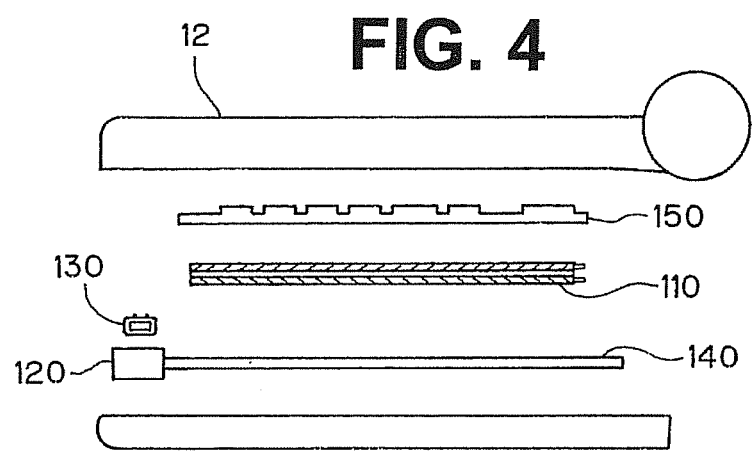

US 8,831,693 B2

MOBILE TERMINAL AND NOISE PREVENTION STRUCTURE OF MOBILE TERMINAL

REFERENCE TO RELATED APPLICATION

This application is a continuation application of Ser. No. 12/159,969 filed on Jul. 02, 2008 which is the National Stage of PCT/JP2007/050762 filed Jan. 19, 2007 which claims the benefit of the priority of Japanese patent application No. 2006-012295 filed on Jan. 20, 2006, the disclosure of which is incorporated herein in its entirety by reference thereto.

TECHNICAL FIELD

The present invention relates to a mobile terminal which is equipped with a microphone and, more particularly, relates to a mobile terminal which reduces influence of electrical noise especially on a microphone. Furthermore, the present invention relates to a noise prevention structure which reduces influence of electrical noise on a microphone with which a mobile terminal is equipped.

BACKGROUND ART

In mobile terminals such as a mobile phone, a microphone of the mobile terminal may be affected by electrical noise generated by the mobile terminal itself. For example, a noise level of a voice signal output from a microphone may increase because of noise generated by various kinds of electrical components such as a transceiver circuit and a liquid crystal display unit, which are equipped in the mobile terminal.

In order to reduce the noise generated by various kinds of electrical components in a mobile terminal, for example, Patent Document 1 describes a noise prevention method which reduces high frequency noise generated by circuit boards which are equipped in a mobile information terminal. In the noise prevention method described in Patent Document 1, the high frequency noise generated by the circuit boards which are equipped in the mobile information terminal is reduced by arranging a conductive substance between the circuit boards, or by forming a conductive substance with metallic foil or metallic plating applied to a housing surface.

[Patent Document 1] Japanese Patent Application Laid-Open No. 2003-264355 (Paragraph 0037 to 0042, FIGS. 2 and 3)

DISCLOSURE OF THE INVENTION

Problems to be Solved by the Invention

If the noise prevention method described in Patent Document 1 is used, the noise generated by the various kinds of electrical components in the mobile terminal may be reduced to some extent. However, in the case where the various kinds of electrical components generate noise, it is not possible to prevent the noise from entering the microphone. Therefore, there is a possibility that the noise level of the voice signal outputted from the microphone increases because of the noise generated by the mobile terminal itself.

An object of the present invention is to provide a mobile terminal and a noise prevention structure of the mobile terminal, both of which can reduce the influence of noise on a microphone of the mobile terminal, in the case where the mobile terminal itself generates noise.

Means for Solving Problems

According to the present invention, there is provided a mobile terminal equipped with a microphone, which includes: a housing component in which a sound hole that is a hole for inputting a voice is formed; and a metallic sheet that is a sheet made by using metal 1 (for example, stainless steel), wherein the microphone is located at a portion where the sound hole of the housing component is formed, and arranged on the opposite side where a voice is inputted in the housing component, and the metallic sheet is arranged between the housing component and the microphone, and connected to a grounding portion of the mobile terminal by using a predetermined grounding method.

It may also be that the metallic sheet is attached to a face to which a voice is inputted in the microphone; and the microphone is mounted in the housing component in a state where the metallic sheet is attached.

It may also be that the microphone includes a microphone body and a microphone housing that is a housing for setting the microphone in; the microphone housing is made by using metal; and the metallic sheet is connected to the grounding portion of the mobile terminal via the microphone housing.

It may also be that the metallic sheet is attached to a face on the opposite side to the face to which a voice is inputted, at the portion where the sound hole of the housing component is formed; and the microphone is mounted in the housing component in a state where the metallic sheet is attached to the housing component.

It may also be that the housing component is formed a metal layer thereon that is a layer formed by using metal on the face on the opposite side to the face to which a voice is inputted; and the metallic sheet is connected to the grounding portion of the mobile terminal via the metal layer.

It may also be that the mobile terminal further includes a connection portion for connecting to an external device, wherein the connection portion includes a conductor portion that is a metallic conductor which is provided so as to surround a connecting terminal of the connection portion, and is arranged on a face on the opposite side to the face to which a voice of the microphone is inputted; and the conductor portion is connected to the grounding portion of the mobile terminal by using a predetermined grounding method.

It may also be that the mobile terminal includes a circuit board on which a predetermined circuit is formed such as a large scale integrated circuit (LSI) for controlling a mobile phone and supplying a power supply to an electroluminescent (EL) sheet, wherein the circuit board is formed a sound hole of the board side thereon that is a hole for inputting a voice, and arranged at a position on the opposite side to which a voice is inputted in the housing component; the microphone, being located at the portion where the sound hole of the housing component is formed, is mounted so as to be located on a face opposite to a face fronting the housing component among faces of the circuit board; and the metallic sheet is attached, on a face opposite to a face mounted the microphone among faces of the circuit board, so as to be located at the portion where the sound hole of the housing component is formed.

It may also be that the circuit board is formed a grounding portion thereon; and the metallic sheet is connected to the grounding portion on the circuit board.

It may also be that a mobile terminal is a mobile terminal equipped with a microphone, which includes a housing component in which a sound hole that is a hole for inputting a voice is formed. The microphone is formed a sound hole of the microphone side therein that is a hole for inputting a voice, located at a portion where the sound hole of the housing component is formed, and arranged on the opposite side where a voice is inputted in the housing component; and the housing component is made by using metal, formed a sound hole therein apart from the sound hole of the microphone side by a predetermined length, and connected to a grounding portion of the mobile terminal by using a predetermined grounding method.

It may also be preferred that the metallic sheet is a sheet formed in a mesh-wise shape.

It may also be that the microphone is arranged at the housing portion where an operation unit is arranged in the mobile terminal.

It may also be that the mobile terminal is a mobile phone.

According to the present invention, there is provided a noise prevention structure of a mobile terminal which is equipped with a microphone, which includes: a housing component in which a sound hole that is a hole for inputting a voice is formed; and a metallic sheet that is a sheet made by using metal. The microphone is located at a portion where the sound hole of the housing component is formed, and arranged on the opposite side where a voice is inputted in the housing component; and the metallic sheet is arranged between the housing component and the microphone, and connected to a grounding portion of the mobile terminal by using a predetermined grounding method.

Effect of the Invention

According to the present invention, the invention is configured such that a mobile terminal has a metallic sheet arranged between a housing component and a microphone, and the metallic sheet is connected to a grounding portion of the mobile terminal. Therefore, in the case where the mobile terminal itself generates noise, the influence of the noise on the microphone which is equipped in the mobile terminal can be reduced.

Further, in the present invention, a mobile terminal is configured such that a connection portion including a metallic conductor portion mounted on a grounding portion of the mobile terminal is arranged on a face on the opposite side to a face to which a voice of a microphone is inputted. Consequently, a level of noise to be entered from a rear face of the microphone in the inside of the mobile terminal can also be reduced.

Furthermore, in the present invention, a mobile terminal is configured such that a housing component is made by using metal, a sound hole of the housing component is formed at a position being apart from a sound hole on the microphone side by a predetermined length, and a housing component is connected to a grounding portion of the mobile terminal. Consequently, in the case where the mobile terminal generates noise, the influence of the noise on the microphone which is equipped in the mobile terminal can be reduced.

BRIEF DESCRIPTION OF THE DRAWINGS

FIG. 3 is a sectional view of a structure example of the mobile phone;

FIG. 4 is an explanation view showing a state where a portion including an operation unit 124 of a housing portion of the mobile phone is exploded;

DESCRIPTION OF REFERENCE NUMERALS

Figure 1:
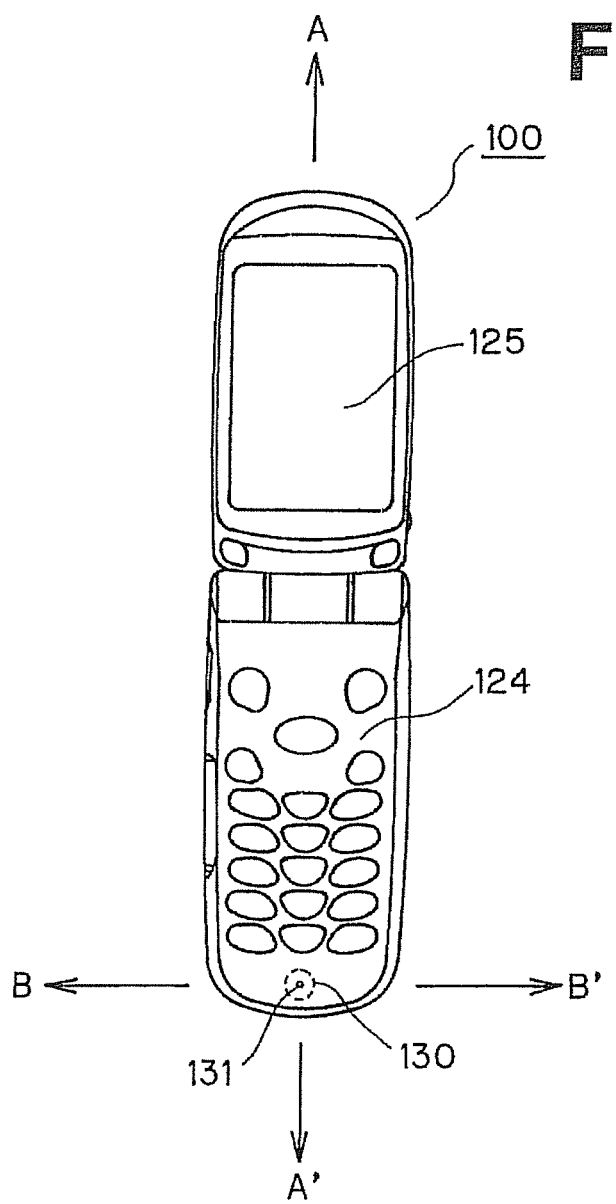
FIG. 1 is a front view seen from a front face of a mobile terminal according to the present invention.

12 Front case
100 Mobile phone
110 EL sheet
120 IO connector
124 Operation unit
130 Microphone
130a Mounting portion
131 Sound hole
132 Mesh
133 FET
134 Microphone folder
135 Tympanum
136 Capsule
137 Sound hole of Microphone
140 Board
150 Key sheet
201 Connector terminal portion
202 External conductor
203 Outer coat portion Best Mode For Carrying Out The Invention Embodiment 1

A first embodiment of the present invention will be described with reference to drawings. First, a concept of a mobile terminal according to the present invention will be described. A mobile terminal like a mobile phone includes a key sheet which uses an EL sheet in an operation unit, and the operation unit emits light by making the EL sheet emit light. Furthermore, in the mobile terminal, a microphone (capacitor microphone) is arranged in the vicinity of the EL sheet. When the EL sheet emits light, in the case where electrical noise generated by the EL sheet enters through a sound hole of the microphone to the inside of the microphone, a level of a gate of an field effect transistor (FET) connected to a tympanum of the microphone is fluctuated; and accordingly, noise is generated in an output signal of the microphone.

In the present invention, a mesh-wise sheet made of stainless steel is attached to a front face of the microphone in order to avoid the above mentioned problems. This reduces a level of the electrical noise to be entered to the inside of the microphone. Furthermore, in order to reduce the electrical noise outputted from the rear face side of the microphone, that is, from the side where a circuit board is arranged, the microphone is arranged on an input/output (IO) connector which is connected to a ground (GND) and shielded. This reduces the noise generated in the output signal of the microphone.

FIG. 1 is a front view of the mobile terminal according to the present invention. As shown in FIG. 1, in the present embodiment, there will be described a case where the mobile terminal is a collapsible mobile phone 100. In addition, the mobile terminal may be a mobile phone other than the collapsible type. The mobile terminal is not limited to the mobile phone; but, the mobile terminal may be a terminal such as a personal handy-phone system (PHS). In the present embodiment, a front face of the mobile phone 100 is defined by a face including an operation unit 124 and a display unit 125 of the mobile phone 100 in a state where the housing is opened.

Further, as shown in FIG. 1, the mobile phone 100 is provided with a sound hole 131 that is a hole for inputting a voice, on a housing component which has a face including the operation unit 124. A microphone 130 is mounted on a rear face of the housing component where the sound hole 131 is provided. In the present embodiment, a surface of the mobile phone 100 is defined by a face which includes the operation unit 124 and the display unit 125 in the housing component, that is, a face which is visible from the outside. And, a rear face of the mobile phone 100 is defined by a face fronting the surface, that is, an invisible face which is concealed in the inside of the mobile phone 100 when the mobile phone 100 is seen from the outside.

Figure 2:
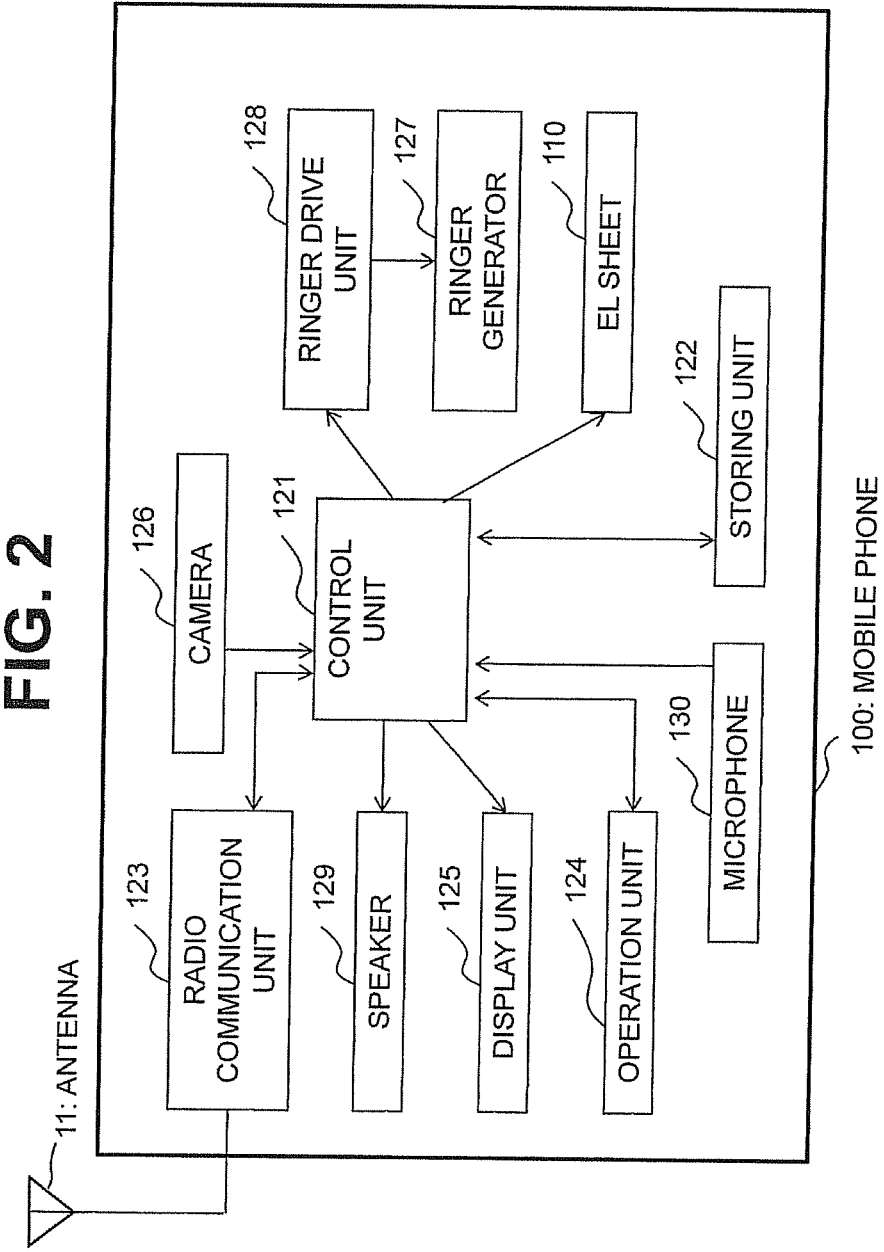
FIG. 2 is a block diagram showing a configuration example of a mobile phone.

FIG. 2 is a block diagram showing a configuration example of the mobile phone 100. As shown in FIG. 2, the mobile phone 100 includes an antenna 11 for transmitting and receiving radio wave, a control unit 121, a storing unit 122, a radio communication unit 123, the operation unit 124, the display unit 125, a camera unit (hereinafter, referred to as "camera") 126, a ringer generator 127, a ringer drive unit 128, a speaker 129 for voice output, and a microphone 130 for voice input.

The control unit 121 is composed of, for example, a central processing unit (CPU) and various kinds of peripheral circuits (not shown in the drawing), and has a function for controlling respective units with which the mobile phone 100 is equipped.

The storing unit 122 is configured by, for example, a storage medium such as a random access memory (RAM), and stores various kinds of data such as a control program in which the control unit 121 executes. In addition, one part of the storing unit 122 may be configured by a read only memory (ROM), and a control program may be stored in the ROM portion.

The radio communication unit 123 has a function for modulating and demodulating a signal in accordance with a predetermined communication protocol. More specifically, the radio communication unit 123 receives a radio signal via the antenna 11 and performs a demodulating process. Furthermore, the radio communication unit 123 modulates a signal outputted from the control unit 121, and performs a transmitting process of a radio signal via the antenna 11.

The operation unit 124 is configured by key buttons which are for inputting phone numbers, for example. The operation unit 124 has a function for outputting an input signal corresponding to a user operation to the control unit 121.

The display unit 125 is configured by, for example, a liquid crystal display (LCD), and arranged at a position that is the inside of the housing when the mobile phone 100 is folded. For example, a standby screen, a function setting screen, and the like are displayed on the display unit 125.

The camera 126, for example, has various kinds of functions with which a digital camera is provided, and includes an image sensor such as a charge coupled device (CCD) which captures an image of a photographic subject, a circuit for outputting image data obtained by capturing an image to the control unit 121, and the like.

The ringer drive unit 128 has a function for outputting a drive signal to the ringer generator 127 in accordance with a control of the control unit 121.

The ringer generator 127 has a function for generating a ring alert in accordance with a drive signal of the ringer drive unit 128. In addition, a ring alert and a ringer melody are sounded from the speaker 129, and a sound signal during telephone conversation is outputted from a receiver.

The EL sheet 110 is provided with a function of emitting light when a power supply is supplied from the control unit 121. In the present embodiment, the EL sheet 110 emitting light causes a user of the mobile phone 100 finding that a key sheet of the mobile phone 100 appears to emit light.

Next, a configuration of the mobile phone 100 will be described. FIG. 3 is a sectional view showing an example of a configuration of the mobile phone 100. In addition, FIG. 3 corresponds to a sectional view of a cut face (face A-A' shown in FIG. 1) in the case where the mobile phone 100 is cut at the center line in a longitudinal direction when the mobile phone 100 is seen from the front face.

As shown in FIG. 3, the mobile phone 100 includes an EL sheet 110, an IO connector 120, a microphone 130, and a board 140. The EL sheet 110 is used for making the key sheet of the operation unit (124) emit light. The microphone 130 is used for inputting a voice signal during verbal communication. In the present embodiment, the microphone 130 is a capacitor microphone. The IO connector 120 is used for fixing the microphone 130.

The board 140 is formed a predetermined circuit thereon. In the present embodiment, the board 140 is mounted with an LSI for controlling the mobile phone 100 and for supplying power to the EL sheet 110. As shown in FIG. 3, in the mobile phone 100, the EL sheet 110 and the microphone 130 are mounted at the same housing portion of the mobile phone 100, and are mounted nearby.

In the mobile phone 100, the EL sheet 110 for making the key sheet emit light and the capacitor microphone 130 are arranged nearby; and accordingly, electrical noise caused by an AC drive voltage of 280Hz is generated between a positive plate and a negative plate of the EL sheet 110 when the EL sheet 110 emits light. The electrical noise radiated from the EL sheet 110 is entered to the inside of the microphone 130 via the sound hole in which the microphone 130 has. As a result, a level of a gate signal connected to the tympanum located in the inside of the microphone 130 is fluctuated; and further, a level of the output signal of the microphone 130 is fluctuated. Then, noise is generated in the signal of the microphone 130.

FIG. 4 is an explanation view showing a state where a portion including the operation unit 124 (FIG. 1) of the housing portion of the mobile phone 100 is exploded. As shown in FIG. 4, a key sheet 150 in which the respective key buttons of the mobile phone 100 are formed is arranged on the rear face side of a housing component (hereinafter, also referred to as "front case") 12 on the side including the operation unit (124). Furthermore, the EL sheet 110 is arranged on the rear face side of the key sheet 150, that is, on the opposite side of the front case 12. In the present embodiment, a power supply is supplied from the control unit 121 (FIG. 2) to the EL sheet 110 and the EL sheet 110 emits light; and accordingly, it is possible to show to a user of the mobile phone 100 as if the key sheet 150 were emitting light.

The board 140 on which various kinds of control circuits are mounted is arranged on the rear face side of the EL sheet 110, that is, on the opposite side of the key sheet 150. The IO connector 120 for connecting the mobile phone 100 to an external device such as a personal computer and a charger is connected to the board 140.

The microphone 130 is arranged on the surface side of the IO connector 120. The microphone 130 is located on the rear face side of the portion where the sound hole 131 (FIG. 1) of the front case 12 is provided.

Figure 5:
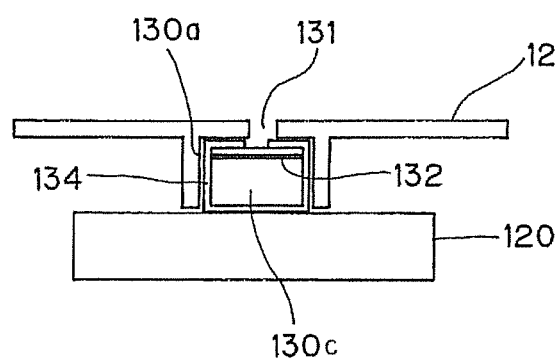
FIG. 5 is a sectional view showing one example of a specific mounting structure of a microphone.

Next, a specific mounting structure of the microphone 130 will be described. FIG. 5 is a sectional view showing one example of a specific mounting structure of the microphone (130). In addition, FIG. 5 corresponds to a view shown by enlarging a portion which includes the microphone 130 in the sectional view shown in FIG. 3.

As shown in FIG. 5, in the front case 12, a mounting portion 130a for mounting the microphone (130) is formed on the rear face side of the portion where the sound hole 131 is provided. Furthermore, the microphone (130) includes a microphone element 130c and a microphone folder 134. The microphone element 130c is fit in the mounting portion 130a of the front case 12 in a state being mounted to the microphone folder 134. The microphone folder 134 is provided with a connector portion (not shown in the drawing) which includes conductive rubber, springs, and lead wires. The microphone folder 134 can be made by using an elastic material such as elastomer like synthetic rubber. The microphone element 130c is electrically connected to a signal wire of the board 140 (FIG. 3) in the mobile phone 100 via the microphone folder 134.

A mesh-wise sheet (hereinafter, referred to as merely "mesh") 132 is attached to the front face of the microphone (130), that is, a face to which a voice is inputted. In the present embodiment, the mesh 132 is made of metal like stainless steel and formed in a twilled shape. In the present embodiment, the mesh 132 has a thickness of 0.12 mm, a wire diameter of 30 μm, an aperture of 33.5 μm (width of aperture portion), and an aperture ratio of 27.8%.

Figure 6:
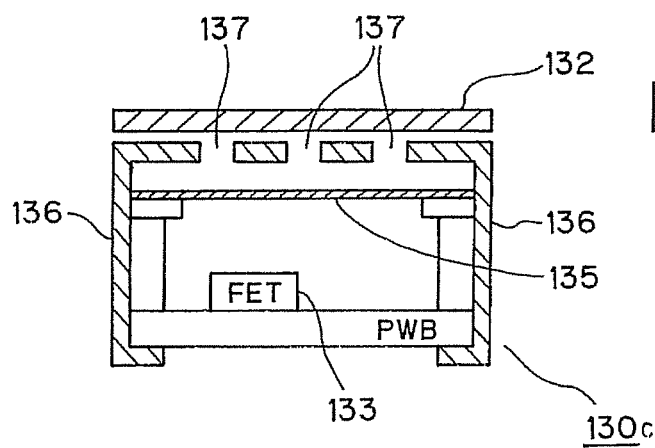
FIG. 6 is a sectional view showing a structure example of a microphone element.

FIG. 6 is a sectional view showing a structure example of a microphone element 130c. FIG. 6 corresponds to a structure of the capacitor microphone element. As shown in FIG. 6, the microphone element 130c is configured such that a microphone body which includes an FET 133 and a tympanum 135 is set in a metallic capsule 136 like alloy including copper. A hole for inputting a voice (hereinafter, also referred to as "sound hole on the microphone side) 137 is provided on the front face of the capsule 136, that is, the face to which a voice is inputted. Furthermore, the mesh 132 is attached to the front face of the capsule 136.

The mesh 132 is electrically connected to the capsule 136 by being arranged so as to come in contact with the metallic capsule 136. The mesh 132 is electrically connected to a ground of the board 140 (FIG. 3) via the capsule 136.

As shown in FIGS. 5 and 6, the metallic mesh 132 is arranged on the front face of the microphone (130). Consequently, even if electrical noise is tried to be entered to the inside of microphone via the microphone sound hole 137 (FIG. 6), the noise is blocked by the mesh 132. In the present embodiment, the electrical noise radiated from the EL sheet 110 (FIG. 3) arranged adjacent to the microphone 130 is possible to be entered via the microphone sound hole 137; however, its input is blocked by the mesh 132. This reduces a level of the electrical noise to be entered to the inside of the microphone 130.

Figure 7:
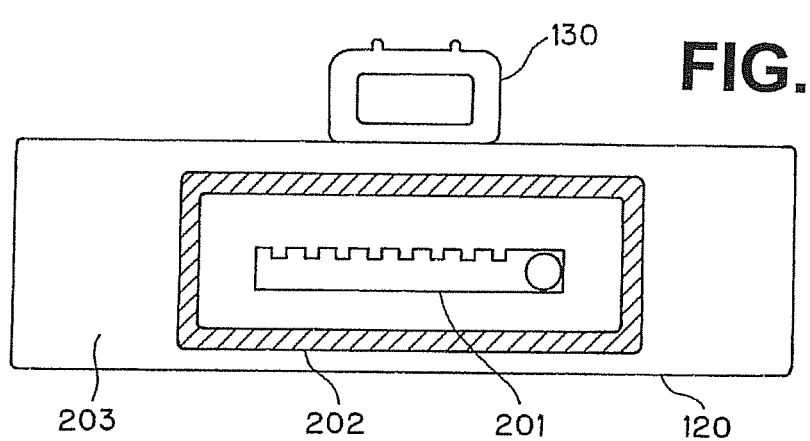
FIG. 7 is a sectional view showing s structure including a microphone and an input/output (IO) connector of the mobile phone.

Furthermore, in the present embodiment, the microphone 130 is arranged on the IO connector 120 which is shielded by being connected to the ground (GND) (FIG. 4); and accordingly, the electrical noise outputted from the rear face of the microphone 130, that is, from the opposite side to the side to which a voice is inputted is also reduced. FIG. 7 is a sectional view showing a structure of a portion including the microphone 130 and the IO connector 120 of the mobile phone 100. FIG. 7 corresponds to a sectional view in the case where the portion including the microphone 130 and the IO connector 120 of the mobile phone 100 is cut at a face (face B-B' shown in FIG. 1) perpendicular to a longitudinal direction of the mobile phone 100.

As shown in FIG. 7, the IO connector 120 includes a connector terminal portion 201 and a metallic external conductor 202 which is arranged so as to surround the connector terminal portion 201. The external conductor 202 is covered with an outer coat portion 203 made by using synthetic resin or the like. Furthermore, the external conductor 202 is connected to the ground of the board 140 (FIG. 3). As shown in FIG. 7, the IO connector 120 is arranged on the rear face side of the microphone 130.

In the present embodiment, the IO connector 120 provided with the grounded external conductor 202 is arranged on the rear face of the microphone 130. This blocks the electrical noise outputted from the rear face side of the microphone 130, for example, the electrical noise generated by the EL sheet 110 (FIG. 3) and inputted from the inside of the housing.

The operation in which the mobile phone 100 makes the EL sheet 110 emit light will be described with reference to FIGS. 1 to 6. In the mobile phone 100, if a predetermined light emission condition for making the key sheet 150 (FIG. 4) emit light is approved, a power supply is supplied from a power supply portion of the board 140 to the EL sheet 110. The light emission condition is, for example, incoming call, during telephone conversation, or user operation of the mobile phone 100. When the conditions are approved, the power supply is supplied from a power supply IC mounted on the board 140 to the EL sheet 110.

When the power supply is supplied to the EL sheet 110, the EL sheet 110 emits light. When the EL sheet 110 emits light, a user can see a state where the key sheet 150 of the operation unit 124 emits light.

When the EL sheet 110 emits light, electrical noise is radiated from the EL sheet 110. At this time, the electrical noise radiated from the EL sheet 110 is possible to be inputted via the sound hole 137 to the inside of the microphone 130 which is arranged adjacent to the EL sheet 110. In the case where the noise is inputted, a signal level of a gate of the FET 133 connected to the tympanum 135 (FIG. 6) of the microphone 130 is fluctuated. As a result, noise is generated in a signal with which the microphone 130 deals, even in a state where a voice is not inputted to the microphone 130 or in a state where there is no ambient noise around.

In the present embodiment, the electrical noise, which is generated by the EL sheet 110 and is tried to be entered to the inside of the microphone 130 via the sound hole 137, is blocked by the stainless steel mesh 132 attached to the front face of the microphone 130, that is, the face where the sound hole 137 (FIG. 6) is located. Consequently, the electrical noise which is possible to be entered to the microphone 130 can be reduced. Furthermore, the electrical noise which is tried to be entered to the inside of the microphone via the sound hole 137 of the microphone 130 is blocked also by a shield effect obtained by connecting the stainless steel mesh 132 to the GND of the mobile phone 100. Therefore, the noise which is possible to be generated in the signal of the microphone 130 can be reduced.

Still furthermore, in the present embodiment, the microphone 130 is arranged on the IO connector 120 which is connected to the ground (GND) and shielded. Therefore, the electrical noise which is tried to be entered through the rear face side of the microphone 130 to the inside of the microphone 130, for example, the electrical noise radiated from the EL sheet 110 can be reduced.

In addition, the microphone 130 is covered with the capsule 136 (FIG. 6) and connected to the GND of the board 140 via the microphone folder 134. Consequently, the influence of the electrical noise outputted from the side face side of the microphone 130 can be reduced.

The mobile phone 100 is provided with a mounting structure of the above mentioned microphone 130; and accordingly, the electrical noise which may be enter through the EL sheet 110 to the inside of the microphone 130 can be blocked. This effect enables to reduce a noise generated in the signal of the microphone 130.

According to the present embodiment, the stainless steel mesh 132 is attached to the front face of the microphone 130, and the mesh 132 is electrically connected to the ground of the mobile phone 100. This structure enables to reduce a level of the electrical noise to be entered to the inside of the microphone 130 via the sound hole 137 of the microphone 130.

Furthermore, according to the present embodiment, the microphone 130 is arranged on the IO connector 120 which is connected to the ground and shielded. This arrangement enables to block the electrical noise radiated from the EL sheet 110, which enters through the rear face of the microphone 130 to the inside of the microphone 130. Consequently, in the mobile phone 100 in which the EL sheet 110 is mounted in the vicinity of the microphone 130, it is possible to reduce generating of noise in a signal of the microphone 130 by the electrical noise due to light emission of the EL sheet 110. Therefore, even if the mobile phone 100 generates noise by itself, the microphone 130 of the mobile phone 100 can reduce the influence of the noise.

In addition, in the present embodiment, there is described a method of preventing the electrical noise radiated from the EL sheet 110 from being entered to the microphone 130 adjacent to the EL sheet 110; however, intended noise for implementing the present invention may be noise generated by electrical components other than the EL sheet 110 in the mobile phone 100. For example, a noise prevention structure (FIG. 6) using the mesh 132 can be applied to an application which reduces entering of noise generated by a liquid crystal display unit and a transceiver circuit in the mobile phone 100.

Embodiment 2

A second embodiment of the present invention will be described with reference to the drawings. In addition, in the present embodiment, as for those similar to constitutional portions in the first embodiment, their detail description will be omitted; and those mainly different from the first embodiment will be described.

Figure 8:
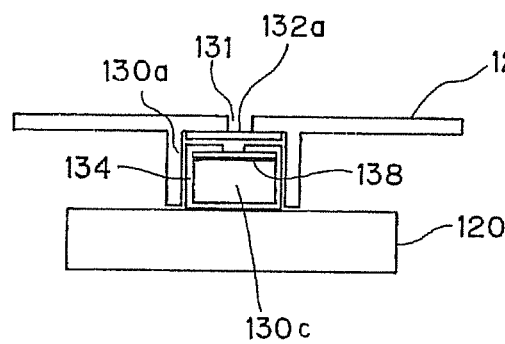
FIG. 8 is a sectional view showing another example of a specific mounting structure of a microphone.

FIG. 8 is a sectional view showing another example of a specific mounting structure of a microphone 130. In the present embodiment, a microphone element 130c is fit in a mounting portion 130a of a front case 12 in a state being mounted to a microphone folder 134, as in the first embodiment (FIG. 5). Furthermore, the microphone element 130c is electrically connected to a signal wire of a board 140 in a mobile phone 100 via the microphone folder 134, as in the first embodiment.

In the present embodiment, a water-shedding mesh 138 is attached to a front face of the microphone 130 in place of the before mentioned metallic mesh 132 (FIG. 6). Furthermore, in the present embodiment, a metallic mesh 132a is attached on the rear face side of a sound hole 131 in the front case 12, that is, on a portion of the mounting portion 130a. In addition, the mesh 132a is a sheet made of metal like stainless steel and formed in a twilled shape, as in the mesh 132 of the first embodiment. Furthermore, its shape has a thickness of 0.12 mm, a wire diameter of 30 μm, an aperture of 33.5 μm (width of aperture portion), and an aperture ratio of 27.8%, for example.

Figure 9:
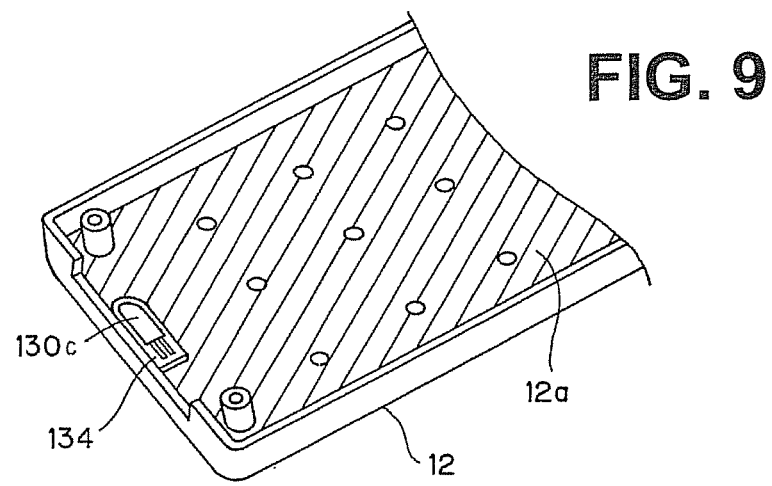
FIG. 9 is a perspective view in the case where a front case is seen from the rear face side.

FIG. 9 is a perspective view in the case where the front case 12 is seen from the rear face side. In the present embodiment, a metal layer 12a is formed by applying metallic plating or the like to the whole of the rear face side of the front case 12. The mesh 132a (FIG. 8) is electrically connected to a ground of the board 140 via the metal layer 12a.

In the present embodiment, the microphone element 130c in which the water-shedding mesh 138 is attached on the sound hole face side, that is, on the side where a voice is inputted is electrically connected to a signal wire of the board 140 in the mobile phone 100 via the microphone folder 134. The microphone element 130c is fit to the mounting portion 130a of the housing case 12 in a state being mounted on the microphone folder 134. In the front case 12, the stainless steel mesh 132a is attached on the rear face of the portion where the sound hole 131 for the microphone 130 is provided, and the mesh 132a is connected to a ground of the mobile phone 100. This can reduce a level in which electrical noise radiated from an EL sheet 110 arranged adjacent to the microphone 130 is entered to the inside of the microphone 130.

Furthermore, in the present embodiment, the microphone 130 is connected to the ground and arranged on a shielded IO connector 120. Therefore, the electrical noise outputted from the rear face side of the microphone 130 can be reduced.

In the present embodiment, the microphone 130 is arranged as described above; and accordingly, the mobile phone 100 is provided with a structure which also reduces the electrical noise outputted from the rear face of the microphone 130.

As described above, according to the present embodiment, the stainless steel mesh 132 is attached to the mounting portion 130a of the microphone 130 of the front case 12 and the mesh 132 is electrically connected to the ground of the mobile phone 100. This can block the electrical noise to be entered to the inside of the microphone 130 via the sound hole for the microphone 130. Therefore, in the case where the mobile phone 100 generates noise by itself, it is possible to reduce the influence of the noise on the microphone 130 with which the mobile phone 100 is equipped.

Embodiment 3

A third embodiment of the present invention will be described with reference to the drawings. In addition, in the present embodiment, as for those similar to constitutional portions in the first embodiment, their detail description will be omitted; and those mainly different from the first embodiment will be described.

Figure 10:
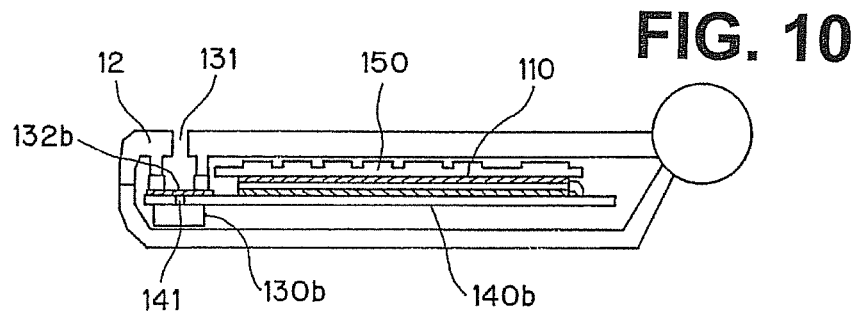
FIG. 10 is a sectional view showing another example of a structure of a mobile phone.
Figure 11:
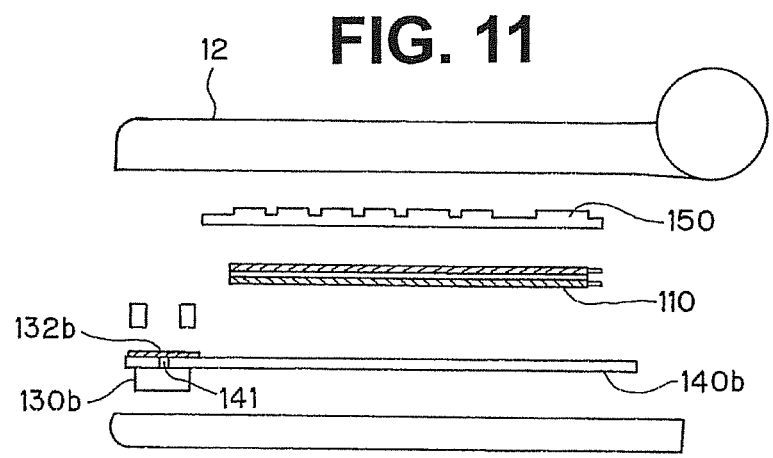
FIG. 11 is an explanation view showing a state where a housing portion including an operation unit of the mobile phone is exploded.

FIG. 10 is a sectional view showing another example of a structure of a mobile phone 100. In addition, FIG. 10 corresponds to a sectional view in the case where a housing portion including an operation unit 124 of the mobile phone 100 is cut at the center line in a longitudinal direction when the mobile phone 100 is seen from the front face. FIG. 11 is an explanation view showing a state where the housing portion including the operation unit 124 of the mobile phone 100 is exploded.

As shown in FIGS. 10 and 11, a key sheet 150 is arranged on the rear face side of a front case 12, as in the first embodiment. An EL sheet 110 is arranged on the rear face side of the key sheet 150. A board 140b is arranged on the rear face side of the EL sheet 110.

Furthermore, in the present embodiment, a microphone (capacitor microphone) 130b is mounted on the rear face side of the board 140b. In this case, the microphone 130b is mounted on the rear face of the board 140b at a position corresponding to a sound hole 131 in the front case 12, as shown in FIG. 10.

A metallic mesh 132b is attached on the surface side of the board 140b. The mesh 132b is attached so as to be located on the surface side of a portion where the microphone 130b is mounted in the board 140b. Furthermore, the mesh 132b is connected to a ground of the board 140b.

A sound hole for passing a voice (hereinafter, also referred to as "sound hole of the board") 141 is provided on the board 140b. Therefore, a voice inputted via the sound hole 131 of the front case 12 is inputted to the microphone 130b passing through the sound hole of the board 141 via the mesh 132b.

As shown in FIGS. 10 and 11, the metallic mesh 132b is arranged on the front face of the microphone 130b, that is, on the side where a voice is inputted via the board 140b; and therefore, electrical noise is blocked by the mesh 132b when the electrical noise is inputted via the sound hole 131 of the front case 12.

According to the present embodiment, the stainless steel mesh 132 is arranged on the front face of the microphone 130 via the board 140, and the mesh 132 is connected to the ground of the board 140. This can reduce a level of the electrical noise to be entered to the inside of the microphone 130. Therefore, in the case where the mobile phone 100 generates noise by itself, it is possible to reduce the influence of the noise on the microphone 130 with which the mobile phone 100 is equipped.

Embodiment 4

A fourth embodiment of the present invention will be described with reference to the drawing. In addition, in the present embodiment, as for those similar to constitutional portions in the first embodiment, their detail description will be omitted; and those mainly different from the first embodiment will be described.

Figure 12:
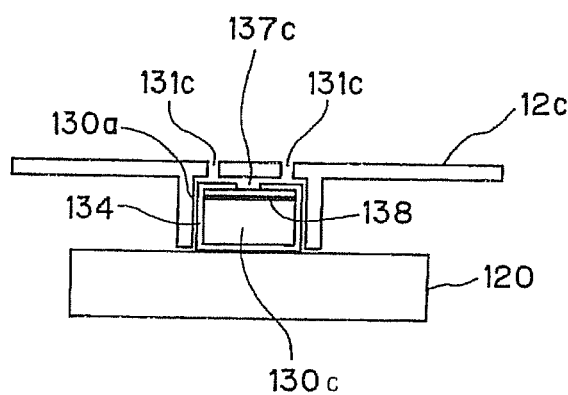
FIG. 12 is a sectional view showing further another example of a specific mounting structure of a microphone.

FIG. 12 is a sectional view showing further another example of a specific mounting structure of a microphone 130. In the present embodiment, a microphone element 130c is fit to a mounting portion 130a of a front case 12c in a state being mounted on a microphone folder 134, as in the first embodiment (FIG. 5). Furthermore, the microphone element 130c is electrically connected to a signal wire of a board 140 in a mobile phone 100 via the microphone folder 134, as in the first embodiment.

In the present embodiment, a water-shedding mesh 138 is attached to a front face of the microphone 130 in place of the metallic mesh 132. In the present embodiment, the front case 12c is metallic and die-cast. Furthermore, the front case 12c is grounded to a ground of the board 140.

A sound hole 131c for inputting a voice is provided in the metallic front case 12c. The sound hole 131c is provided in the front case 12c so as to differ in the location of the sound hole 137c of the microphone 130 which is fit in the mounting portion 130a.

The front case 12c is made by using metal; and therefore, electrical noise which is tried to be entered through the sound hole 131c of the front case 12c to the inside is blocked by the metallic front case 12c.

According to the present embodiment, the front case 12c is made by using metal, and the sound hole 131c is formed in the front case 12c so as to differ in the location of the sound hole 137c of the microphone 130. Therefore, the electrical noise to be entered to the inside of the microphone 130 passing through the sound hole 137c of the microphone 130 can be blocked. Therefore, in the case where the mobile phone 100 generates noise by itself, it is possible to reduce the influence of the noise on the microphone 130 which is equipped in the mobile phone 100.

The present invention can be applied to mobile terminals such as a mobile phone and, more particularly, can be applied to an application which reduces influence of noise in a mobile terminal which is equipped with a microphone.

What is claimed is:

1. A mobile terminal equipped with a microphone, comprising:
   a housing component in which a sound hole for inputting a voice is formed;
   a metallic sheet,
   the microphone is located at a portion where the sound hole of the housing component is formed, and arranged on an opposite side of a surface of the housing component in correspondence to the sound hole,
   the metallic sheet is arranged between the housing component and the microphone, and connected to a grounding portion of the mobile terminal by using a predetermined grounding method,
   an electroluminescent (EL) sheet is arranged in an operation unit,
   the metallic sheet is attached to a face of the microphone to which a voice is inputted in the microphone,
   the microphone with the attached metallic sheet is mounted in the housing component,
   the microphone includes a microphone body and a microphone housing in which the microphone body is disposed,
   the microphone housing is made of metal,
   the metallic sheet is connected to the grounding portion of the mobile terminal via the microphone housing,
   the mobile terminal further comprises a connection portion for connecting the mobile terminal to an external device through a connecting terminal of the connection portion,
   the connection portion includes a metallic conductor portion that surrounds the connecting terminal to shield the connection portion,
   the connection portion is arranged on a rear face of the microphone which is an opposite side to a face to which a voice is inputted in the microphone, a part of an outer face of the metallic conductor portion being opposed to the rear face of the microphone to shield the rear face of the microphone, and
   the metallic conductor portion is connected to the grounding portion of the mobile terminal by using a predetermined grounding method.

2. The mobile terminal according to claim 1, wherein the metallic sheet is a sheet formed in a mesh-wise shape.

3. The mobile terminal according to claim 1, wherein the microphone is arranged at the housing portion where an operation unit is arranged in the mobile terminal.

4. The mobile terminal according to claim 1, wherein the mobile terminal is a mobile phone.

* * * * *